US010921667B2

(12) United States Patent
Hosokawa et al.

(10) Patent No.: US 10,921,667 B2
(45) Date of Patent: Feb. 16, 2021

(54) DISPLAY DEVICE

(71) Applicant: Japan Display Inc., Tokyo (JP)

(72) Inventors: Daichi Hosokawa, Tokyo (JP);
Naoyuki Obinata, Tokyo (JP);
Masakatsu Kitani, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 16/296,261

(22) Filed: Mar. 8, 2019

(65) Prior Publication Data

US 2019/0278144 A1    Sep. 12, 2019

(30) Foreign Application Priority Data

Mar. 9, 2018 (JP) ............................. JP2018-043486

(51) Int. Cl.
| | |
|---|---|
| H01L 27/12 | (2006.01) |
| G02F 1/1362 | (2006.01) |
| G02F 1/1368 | (2006.01) |
| G02F 1/1339 | (2006.01) |
| G02F 1/1343 | (2006.01) |
| G02F 1/1333 | (2006.01) |

(52) U.S. Cl.
CPC ...... *G02F 1/136286* (2013.01); *G02F 1/1368* (2013.01); *G02F 1/13394* (2013.01); *G02F 1/134363* (2013.01); *H01L 27/124* (2013.01); *G02F 1/13338* (2013.01); *G02F 2001/13629* (2013.01); *G02F 2001/134372* (2013.01); *G02F 2201/121* (2013.01); *G02F 2201/123* (2013.01)

(58) Field of Classification Search
CPC ............... H01L 27/124; H01L 27/1214; H01L 27/1248; G02F 1/136286; G02F 1/13394; G02F 1/134363; G02F 1/1368; G02F 2001/1369
USPC .......................................................... 257/72
See application file for complete search history.

(56) References Cited

U.S. PATENT DOCUMENTS

| | | | | |
|---|---|---|---|---|
| 2003/0184699 A1* | 10/2003 | Matsumoto | ....... | G02F 1/134363 349/141 |
| 2007/0171319 A1* | 7/2007 | Fujita | ................ | G02F 1/134309 349/43 |
| 2014/0085558 A1* | 3/2014 | Lee | ........................ | G02B 5/201 349/43 |
| 2014/0118666 A1* | 5/2014 | Lee | ..................... | G02F 1/13394 349/106 |
| 2015/0115264 A1* | 4/2015 | Kato | ................. | H01L 29/66765 257/43 |
| 2016/0238903 A1 | 8/2016 | Morimoto et al. | | |

FOREIGN PATENT DOCUMENTS

JP    2016-148807 A    8/2016

* cited by examiner

*Primary Examiner* — Stephen W Smoot
(74) *Attorney, Agent, or Firm* — Xsensus LLP (57) ABSTRACT

According to one embodiment, a display device includes a first common electrode, a second common electrode separated from the first common electrode in a first direction and a first metal wiring extending in the first direction and overlapping the first common electrode and the second common electrode. The first metal wiring is located between the first common electrode and the second common electrode, and the first metal wiring includes a first end portion overlapping one of the first common electrode and the second common electrode.

17 Claims, 10 Drawing Sheets

DISPLAY DEVICE

CROSS-REFERENCE TO RELATED APPLICATIONS

This application is based upon and claims the benefit of priority from Japanese Patent Application No. 2018-043486, filed Mar. 9, 2018, the entire contents of which are incorporated herein by reference.

FIELD

Embodiments described herein relate generally to a display device.

BACKGROUND

In recent years, various techniques are studied to improve the display quality of display devices. For example, such a technique has been disclosed that a display device comprises metallic wiring in which a through-hole is formed, and a distal end of a spacer is disposed inside the through hole.

DETAILED DESCRIPTION

In general, according to one embodiment, a display device comprises a first common electrode, a second common electrode separated from the first common electrode in a first direction and a first metal wiring extending in the first direction and overlapping the first common electrode and the second common electrode, the first metal wiring being located between the first common electrode and the second common electrode, and the first metal wiring comprising a first end portion overlapping one of the first common electrode and the second common electrode.

According to another embodiment, a display device comprises a first pixel electrode, a first switching element electrically connected to the first pixel electrode via a first connection electrode, a signal line electrically connected to the first switching element and extending in the first direction, a first wiring overlapping the signal line and extending in the first direction, a second wiring overlapping the signal line and separated from the first wiring in the first direction, a first common electrode overlapping the first wiring and a second common electrode overlapping the second wiring, the first connection electrode being located between the first common electrode and the second common electrode, the first wiring including a first end portion and the second wiring including a second end portion, the first end portion and the second end portion opposing each other, and the first end portion and the second end portion overlapping the first common electrode.

The embodiments will be described hereinafter with reference to the accompanying drawings. Note that the disclosure is presented for the sake of exemplification, and any modification and variation conceived within the scope and spirit of the invention by a person having ordinary skill in the art are naturally encompassed in the scope of invention of the present application. Moreover, in some cases, in order to make the description clearer, the widths, thicknesses, shapes, etc., of the respective parts are schematically illustrated in the drawings and compared to the actual modes. However, the schematic illustration is merely an example, and adds no restrictions to the interpretation of the invention. In addition, in the specification and drawings, the structural elements, which have functions identical or similar to the functions described in connection with preceding drawings, are denoted by like reference numbers, and an overlapping detailed description thereof is omitted unless otherwise necessary.

Figure 1:
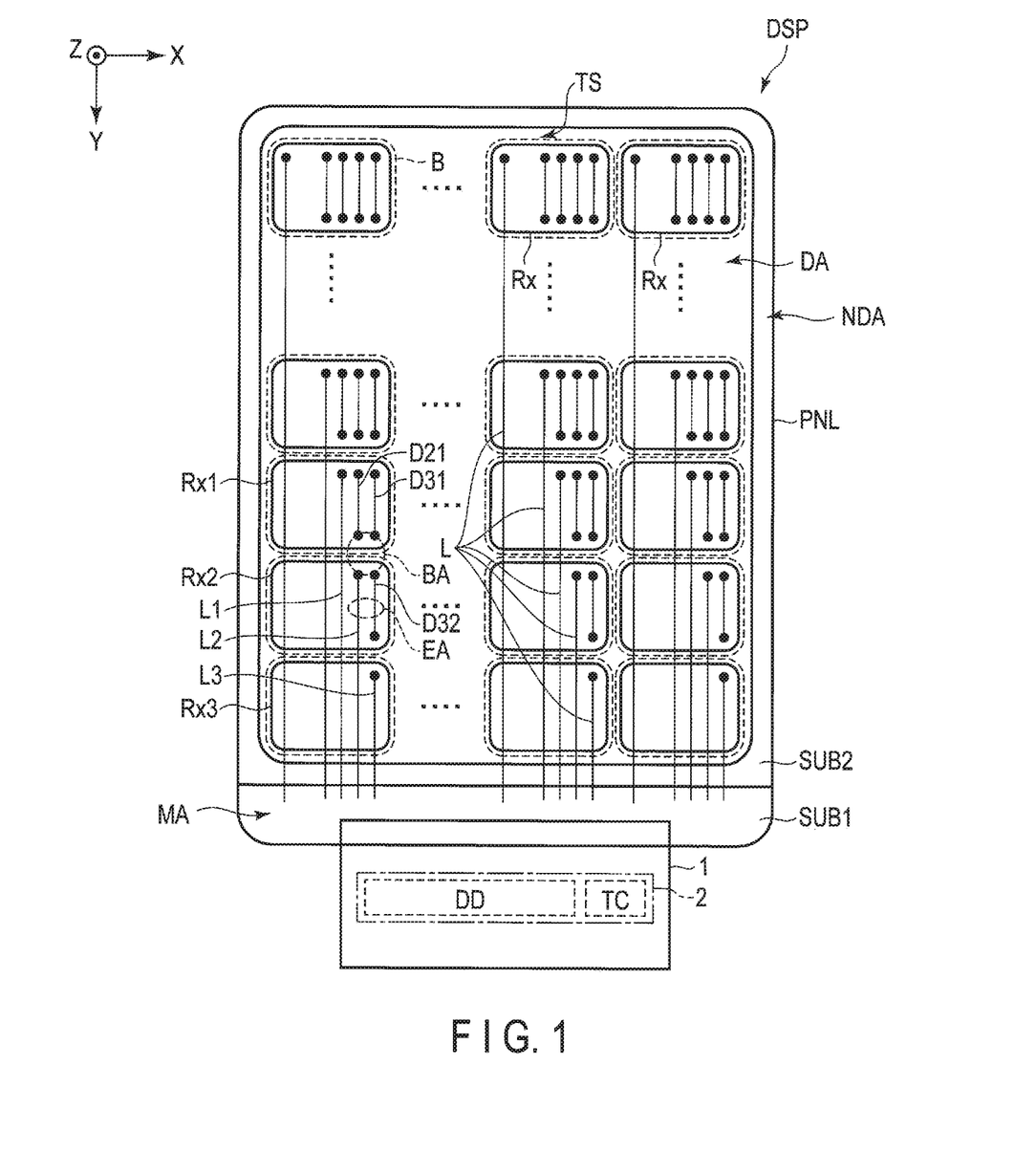
FIG. 1 is a plan view showing a configuration example of a display device DSP of one embodiment.

FIG. 1 is a plan view showing a configuration example of a display device DSP of one of the embodiments. For example, a first direction X, a second direction Y and a third direction Z are orthogonal to each other, but they may cross each other at an angle other than 90 degrees. The first direction X and the second direction Y correspond to directions parallel to the main surface of a substrate which constitutes the display device DSP, and the third direction Z corresponds to the thickness direction of the display device DSP. In this specification, a position by the side of the distal end of the arrow indicating the third direction Z is referred to as "up", and a position on an opposite side to the distal end of the arrow is referred to as "down". Such expressions as "a second member on a first member" and "a second member under a first member" covers situations that the second member may be in contact with the first member, and may be separated from the first member. Moreover, let us suppose an observation position located on a distal end side of the arrow indicating the third direction Z, from which the display device DSP is to be observed. Here, viewing an object toward the X-Y plane defined by the first direction X and the second direction Y from this observation position is called plan view. Note that in this specification, the first direction X and the second direction Y can as well be referred to as the first direction Y and the second direction X, respectively.

Here, a plan view of a display device DSP in the X-Y plane is shown. The display device DSP comprises a display panel PNL, a flexible printed circuit 1 and an IC chip 2.

The display panel PNL includes a first substrate SUB1, a second substrate SUB2 and a touch sensor TS. The first substrate SUB1 and the second substrate SUB2 overlap each other in plan view. The display panel PNL includes a display area DA which displays images and a frame-shaped non-display area NDA which surrounds the display area DA. The touch sensor TS and the display area DA are located in a region where the first substrate SUB1 and the second substrate SUB2 overlap each other. The first substrate SUB1 includes a mounting portion MT extending out in the second direction Y further from overlapping region with the second substrate SUB2. The flexible printed circuit 1 is connected to the mounting portion MA. The IC chip 2 is connected to the flexible printed circuit 1. Note that the IC chip 2 may be connected to the mounting portion MA. The IC chip 1 comprises a built-in display driver DD, which outputs signals necessary to display images in a display mode for displaying images. In the example illustrated, the IC chip 2 comprises a built-in touch controller TC, which controls a touch sensing mode which detects approaching or contacting of an object with respect to the display device DSP. In the drawing, the IC chip 2 is indicated by an alternate long and short dash line, and a display driver DD and the touch controller TC are indicated by dotted lines.

The touch sensor TS to be described here is of a self-capacitive type, but it may be of a mutual capacitive type. The touch sensor TS comprises a plurality of sensor electrodes Rx and a plurality of sensor wiring lines L. The sensor electrodes Rx are located in the display area DA, and are arranged in a matrix in the first direction X and the second direction Y. One sensor electrode Rx constitutes one sensor block B. The sensor block B is a minimum unit enabling touch sensing. The sensor wiring lines L each extend in the second direction Y in the display area DA, and are arranged in the first direction X. Each of the sensor wiring lines L is provided in a respective position which overlaps, for example, a respective signal line S, which will be described later. Moreover, each of the sensor wiring lines L is drawn out to the non-display area NDA, and is electrically connected to the IC chip 2 via the flexible printed circuit 1.

Here, let us focus on the relationship between sensor wiring lines L1 to L3 arranged in the first direction X and sensor electrodes Rx1 to Rx3 arranged in the second direction Y with each other. The sensor wiring line L1 overlaps the sensor electrodes Rx1 to Rx3, and is electrically connected to the sensor electrode Rx1.

The sensor wiring line L2 overlaps the sensor electrodes Rx2 and Rx3, and is electrically connected to the sensor electrode Rx2. A dummy wiring line D21 is provided to be separated from the sensor wiring line L2. The dummy wiring line D21 overlaps the sensor electrode Rx1, and is electrically connected to the sensor electrode Rx1. The sensor wiring line L2 and the dummy wiring line D21 are located on the same signal line, as will be described later.

The sensor wiring line L3 overlaps the sensor electrode Rx3, and is electrically connected to the sensor electrode Rx3. A dummy wiring line D31 is provided to overlap the sensor electrode Rx1, and is electrically connected to the sensor electrode Rx1. A dummy wiring line D32 is provided to be separated from the dummy wiring line D31 and the sensor wiring line L3. The dummy wiring line D32 overlaps the sensor electrode Rx2, and is electrically connected to the sensor electrode Rx2. The sensor wiring line L3, the dummy wiring lines D31 and D32 are located on the same signal line.

In the touch sensing mode, the touch controller TC applies touch drive voltage to the sensor wiring lines L. Thus, the touch drive voltage is applied to the sensor electrodes Rx, and the sensing is carried out with the sensor electrodes Rx. The sensor signal corresponding to the sensing result by the sensor electrodes Rx is output to the touch controller TC via the sensor wiring lines L. The touch controller TC or an external host detects whether or not an object is approaching or contacting with respect to the display device DSP, and position coordinates of the object based on the sensor signal.

Note that, in the display mode, the sensor electrodes Rx function as a common electrode CE to which common voltage (Vcom) is applied. The common voltage is applied thereto, for example, from a voltage supply portion contained in the display driver DD via the sensor wiring lines L.

Figure 2:
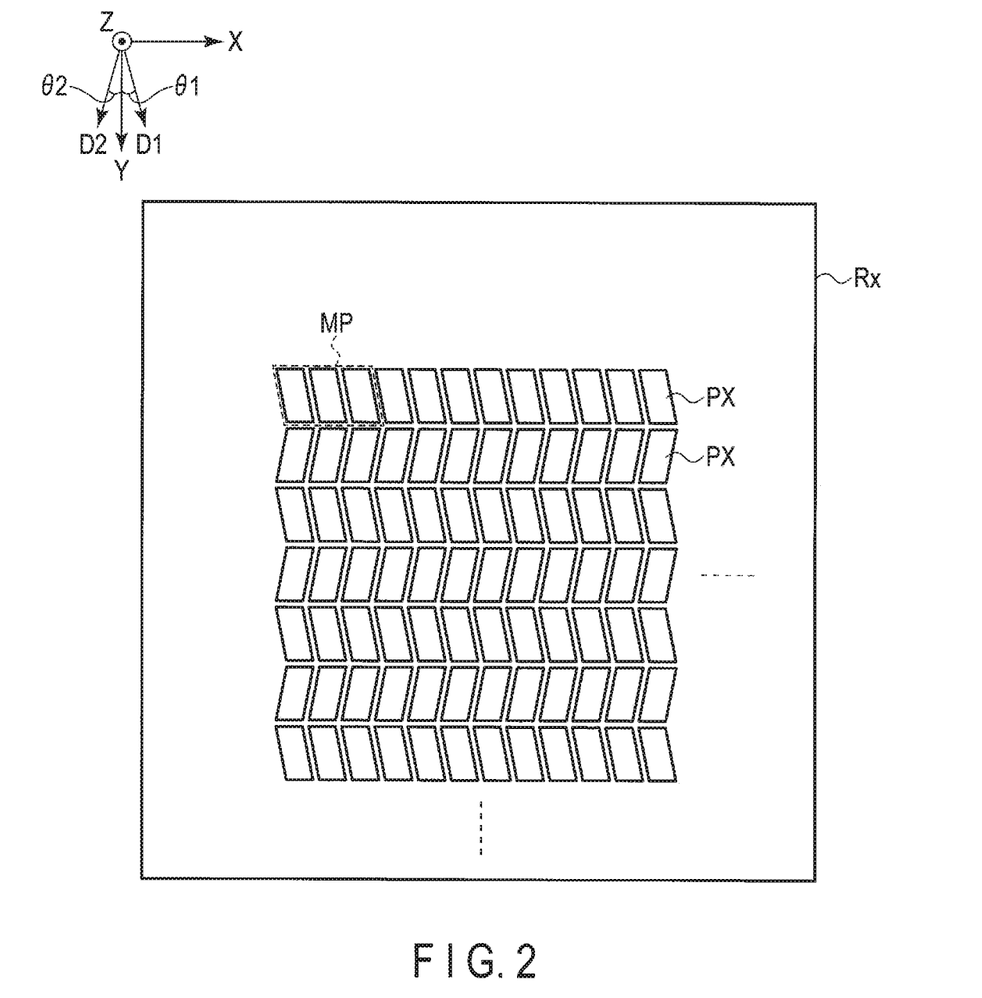
FIG. 2 is a plan view showing a sensor electrode Rx shown in FIG. 1.

FIG. 2 is a plan view showing a sensor electrode Rx shown in FIG. 1. In FIG. 2, a direction which intersects the second direction Y counter-clockwise at an acute angle is defined as a direction D1, and a direction which intersects the second direction Y clockwise at an acute angle is defined as a direction D2. Note that an angle θ1 made between the second direction Y and the direction D1 is substantially the same as an angle 92 made between the second direction Y and the direction D2.

One sensor electrode Rx is disposed over a plurality of pixels PX. In the example illustrated, those of the pixels PX, which are located in odd-numbered lines along the second direction Y extend along the direction D1. Those of the pixels PX, which are located in even-numbered lines along the second direction Y extend along the direction D2. Note that a pixel PX here indicates a minimum unit individually controllable according to a pixel signal, and it may be referred to as a subpixel. Moreover, a minimum unit for realizing color display may be referred to as a main pixel MP. The main pixel MP is configured to comprise sub-pixels PX which exhibit different colors. For example, the main pixel MP comprises a red pixel which displays red, a green pixel which displays green, and a blue pixel which displays blue as subpixels PX. The main pixel MP may comprise a white pixel which displays white.

For example, in one sensor electrode Rx, sixty to seventy main pixels MP are arranged in the first direction X, and sixty to seventy main pixels MP are arranged in the second direction Y.

Figure 3:
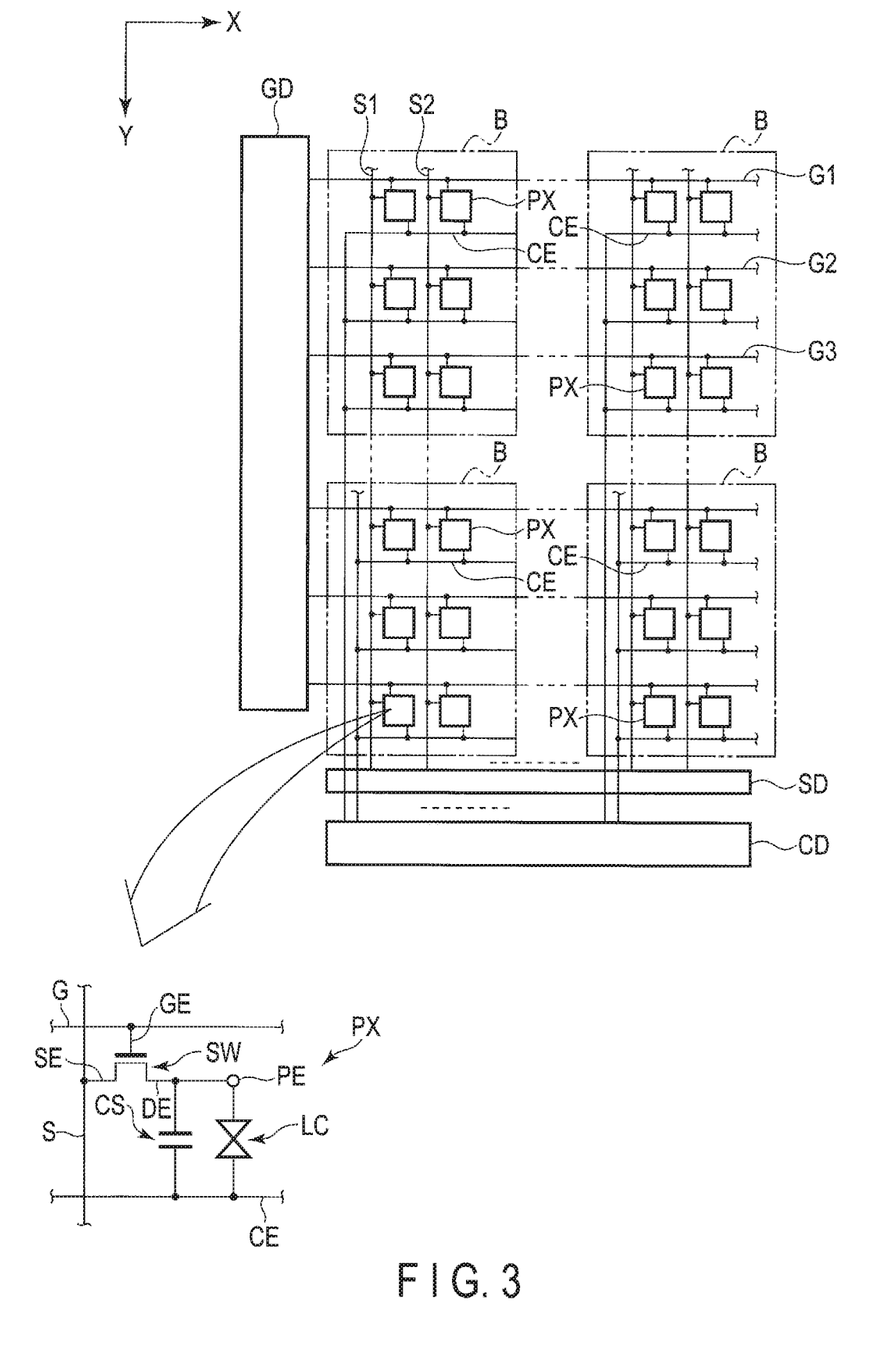
FIG. 3 is a diagram showing a basic structure and equivalent circuit of pixels PX.

FIG. 3 is a diagram illustrating a basic structure and an equivalent circuit of pixels PX. A plurality of scanning lines G1, G2, . . . are connected to a scanning line drive circuit GD. A plurality of signal lines S1, S2, . . . are connected to a signal line drive circuit SD. The scanning lines G and the signal lines S may not necessarily extend linearly, but part of the lines may be bent. For example, even if partially bent, the signal lines S extend in the second direction Y.

The common electrode CE is provided in each of the sensor blocks B. The common electrode CE is connected to the voltage supply portion CD of the common voltage (Vcom), and is provided over a plurality of pixels PX. Moreover, the common electrode CE is connected also to the respective touch controller TC as described above, and functions also as a sensor electrode Rx.

Each pixel PX comprises a switching element SW, a pixel electrode PE, a common electrode CE, a liquid crystal layer LC and the like. The switching element SW is constituted by a thin-film transistor (TFT), for example, and is electrically connected to the respective scanning line G and the respective signal line S. The respective scanning line G is electrically connected to the gate electrode GE of the switching element SW in each of the pixels PX arranged in the first direction X. The respective signal line S is connected to the source electrode SE of the switching element SW in each of the pixels PX arranged in the second direction Y. The pixel electrode PE is electrically connected to the drain electrode DE of the switching element SW. Each of the pixel electrodes PE opposes the respective common electrode CE, and drives the liquid crystal layer LC by an electric field produced between the respective pixel electrode PE and the respective common electrode CE. A storage capacity CS is formed between, for example, an electrode at the same potential as that of the common electrode CE and an electrode at the same potential as that of the pixel electrode PE.

Figure 4:
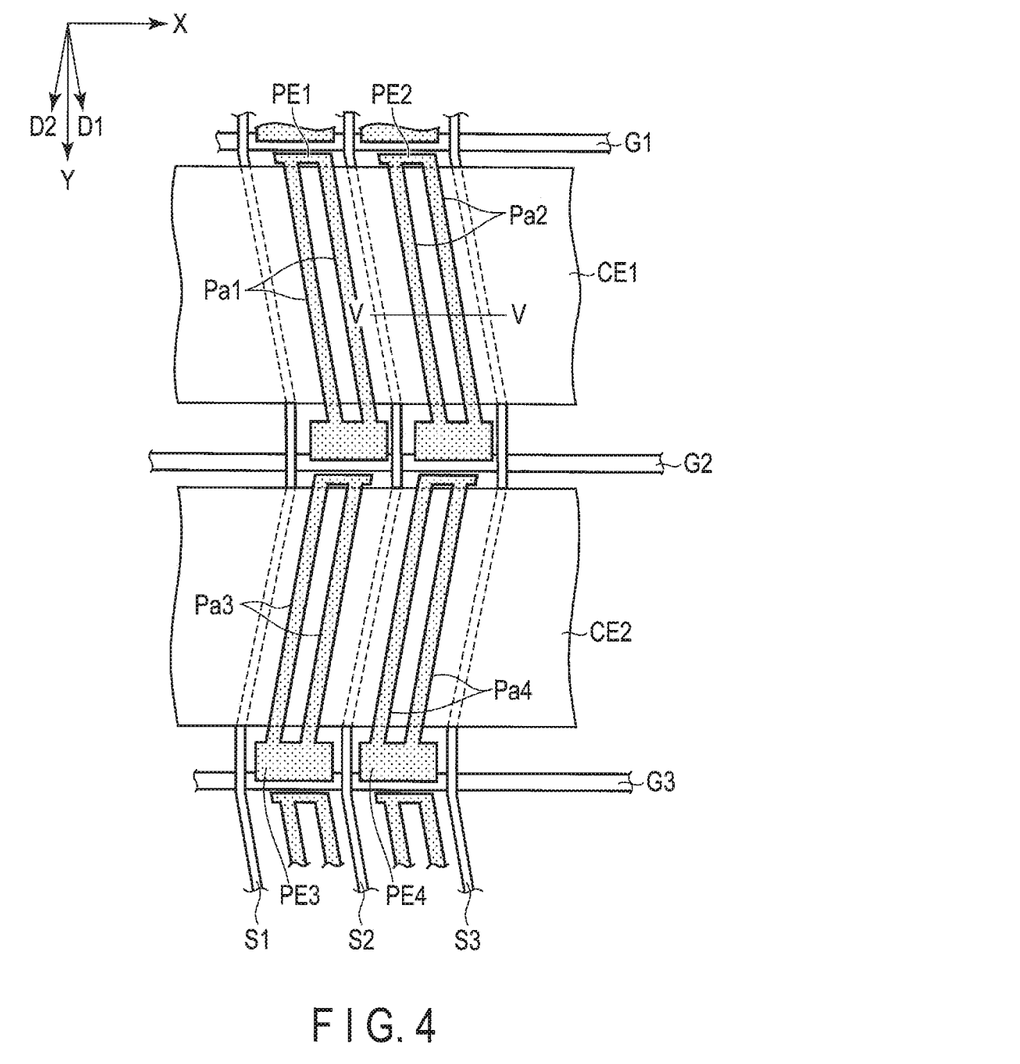
FIG. 4 is a plan view showing an example of layout of pixels.

FIG. 4 is a plan view showing an example of layout of the pixels, which is more specifically an enlarged view of layout of the pixels in a boundary area BA between sensor blocks B shown in FIG. 1(, which is a region over between sensor electrodes Rx1 and Rx2). The scanning lines G1 to G3 each extend linearly in the first direction X, and are arranged in the second direction Y at intervals. The signal lines S1 to S3 each extend substantially in the second direction Y, and are arranged in the first direction X at intervals.

The pixel electrodes PE1 and PE2 are disposed between the scanning lines G1 and G2. The pixel electrodes PE1 and PE2 are arranged in the first direction X. The pixel electrodes PE3 and PE4 are disposed between the scanning lines G2 and G3. The pixel electrodes PE3 and PE4 are arranged in the first direction X. The pixel electrodes PE1 and PE3 are disposed between the signal lines S1 and S2, and the pixel electrodes PE2 and PE4 are disposed between the signal lines S2 and S3.

The pixel electrodes PE1 and PE2 comprise stripe electrodes Pa1 and Pa2, respectively, extending in the direction D1. The pixel electrodes PE3 and PE4 comprise stripe electrodes Pa3 and Pa4, respectively, extending in the direction D2. In the example illustrated, the number of each of the stripe electrodes Pa1 to Pa4 is two, but it may be one or three or more.

The common electrodes CE1 and CE2 are equivalent respectively to the sensor electrodes Rx1 and Rx2 shown in FIG. 1. The common electrode CE1 overlap the signal lines S1 to S3 thereon. The pixel electrodes PE1 and PE2 overlap the common electrode CE1 thereon. The common electrode CE2 overlap the signal lines S1 to S3 thereon. The pixel electrodes PE3 and PE4 overlap the common electrode CE2 thereon. The common electrode CE2 is separated from the common electrode CE1 in the second direction Y to as to electrically insulate them from each other. In the example illustrated, the scanning line G2 is located between the common electrodes CE1 and CE2.

Figure 5:
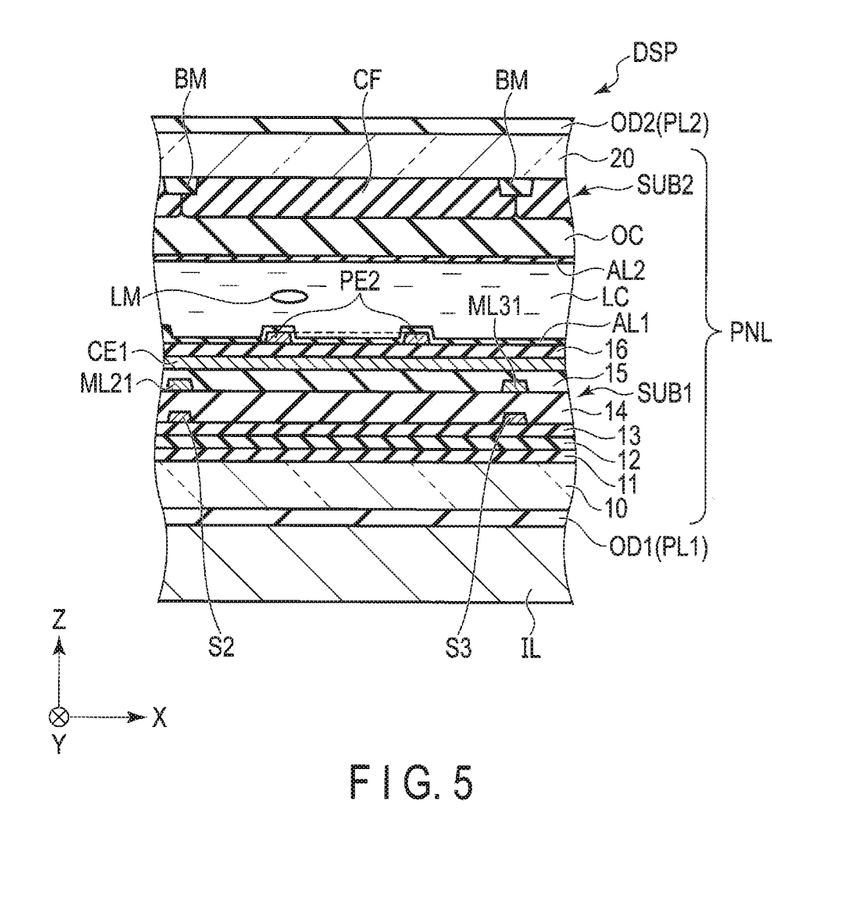
FIG. 5 is a cross section of a display device DSP taken along line V-V shown in FIG. 4.

FIG. 5 is a cross section of the display device DSP taken along line V-V shown in FIG. 4. The example illustrated is equivalent to the case where a fringe field switching (FFS) mode, which is one of the display modes which utilize a lateral electric field, is applied.

The display device DSP comprises a display panel PNL, optical elements OD1 and OD2, and an illumination unit IL. The illumination unit IL, the optical element OD1, the display panel PNL, and the optical element OD2 are arranged in this order in the third direction Z. The display panel PNL comprises a first substrate SUB1, a second substrate SUB2 and a liquid crystal layer LC.

The first substrate SUB1 comprises an insulating substrate 10, insulating films 11 to 16, the signal lines S2 and S3, metal wirings ML21 and ML31, the common electrode CE1, the pixel electrode PE2, an alignment film AL1 and the like.

The insulating substrate 10 is a light transmissive substrate such as a glass substrate or a flexible resin substrate. On the insulating substrate 10, the insulating films 11 to 13 are arranged in this order in the third direction Z.

The signal lines S2 and S3 are formed on the insulating film 13 and covered by the insulation film 14. The signal lines S2 and S3 are located in the same layer as that of other signal line S1 (not shown). The signal lines S2 and S3 are formed of a metal material such as aluminum (Al), titanium (Ti), silver (Ag), molybdenum (Mo), tungsten (W), copper (Cu) or chromium (Cr), or an alloy of any combination of these metal materials, and may be of a single- or multi-layer structure. For example, the signal lines S2 and S3 are of a multilayered body in which titanium (Ti), aluminum (Al) and titanium (Ti) are stacked one on another in this order.

The metal wirings ML21 and ML31 are located on the insulating film 14, and covered by the insulating film 15. The metal wiring ML21 is located immediately above the signal line S2, and the metal wiring ML31 is located immediately above the signal line S3. The metal wirings ML21 and ML31 may be formed of a material listed above or an alloy of any combination of these limited materials and may be of a single- or multi-layer structure. For example, the metal wirings ML21 and ML31 are of a multilayered body in which titanium (Ti), aluminum (Al) and titanium (Ti) are stacked one on another in this order, or molybdenum (Mo), aluminum (Al) and molybdenum (Mo) are stacked one on another in this order.

The common electrode CE1 is located on the insulating film 15 and covered by the insulating film 16. The common electrode CE1 is a transparent electrode formed of a transparent conductive material such as indium tin oxide (ITO) or indium zinc oxide (IZO). The pixel electrode PE2 is located on the insulating film 16 and covered by the alignment film AL1. The pixel electrode PE2 is a formed of a transparent electrode formed of a transparent conductive material such as ITO or IZO.

The insulating films 11 to 13 and the insulating film 16 are inorganic insulating films each formed of an inorganic insulating material such as a silicon oxide, silicon nitride or silicon oxynitride, and may be of a single- or multi-layer structure. The insulating films 14 and 15 each are an organic insulating film formed of, for example, an organic insulating material such as an acrylic resin. Note that the insulating film 15 may be an inorganic insulating film.

The second substrate SUB2 comprises an insulating substrate 20, light-shielding layers BM, color filters CF, an overcoat layer OC, an alignment film AL2 and the like.

As in the case of the insulating substrate 10, the insulating substrate 20 is a light transmissive substrate such as a glass substrate or a resin substrate. The light-shielding layers BM and the color filters CF are located on the second insulating substrate 20 on a side opposing the first substrate SUB1. The color filters CF are disposed in positions opposing the respective pixel electrodes PE2, and partially overlap the respective light-shielding layers BM. The color filters CF include color filters of red, green and blue. The overcoat layer OC covers the color filters CF. The overcoat layer OC is formed of a transparent resin material. The alignment film AL2 covers the overcoat layer OC. The alignment film AL1 and the alignment film AL2 are each formed of, for example, a material which exhibits horizontal alignment properties. The first substrate SUB1 and the second substrate SUB2 described above are disposed such that the alignment film AL1 and the alignment film AL2 oppose each other.

The liquid crystal layer LC is located between the first substrate SUB1 and the second substrate SUB2, and is held between the alignment film AL1 and the alignment film AL2. The liquid crystal layer LC contains liquid crystal molecules LM. The liquid crystal layer LC is formed from a positive type liquid crystal material (a dielectric constant anisotropy of which is positive), or a negative type liquid crystal material (a dielectric constant anisotropy of which is negative).

The optical element OD1 including a polarizer PL1 is adhered to the insulating substrate 10. The optical element OD2 including a polarizer PL2 is adhered to the insulating substrate 20. If necessary, the optical element OD1 and the optical element OD2 may each comprise a retardation film, a scattering layer, an antireflective layer, or the like.

In the display panel PNL with such a structure as described above, the liquid crystal elements LM are initially aligned in a predetermined direction between the alignment film AL1 and the alignment film AL2 in an OFF state in which an electric field is not formed between the pixel electrode PE and the common electrode CE. In such an OFF state, light irradiated towards the display panel PNL from the illumination unit IL is absorbed by the optical element OD1 and the optical element OD2, thus creating dark display. On the other hand, in an ON state in which an electric field is formed between the pixel electrode PE and the common electrode CE, the liquid crystal elements LM are aligned in a direction which differs from the direction of the initial alignment by the electric field, and the direction of alignment is controlled by the electric field. In such an ON state, part of the light from the illumination unit IL is transmitted through the optical element OD1 and the optical element OD2, thus creating bright display.

Figure 6:
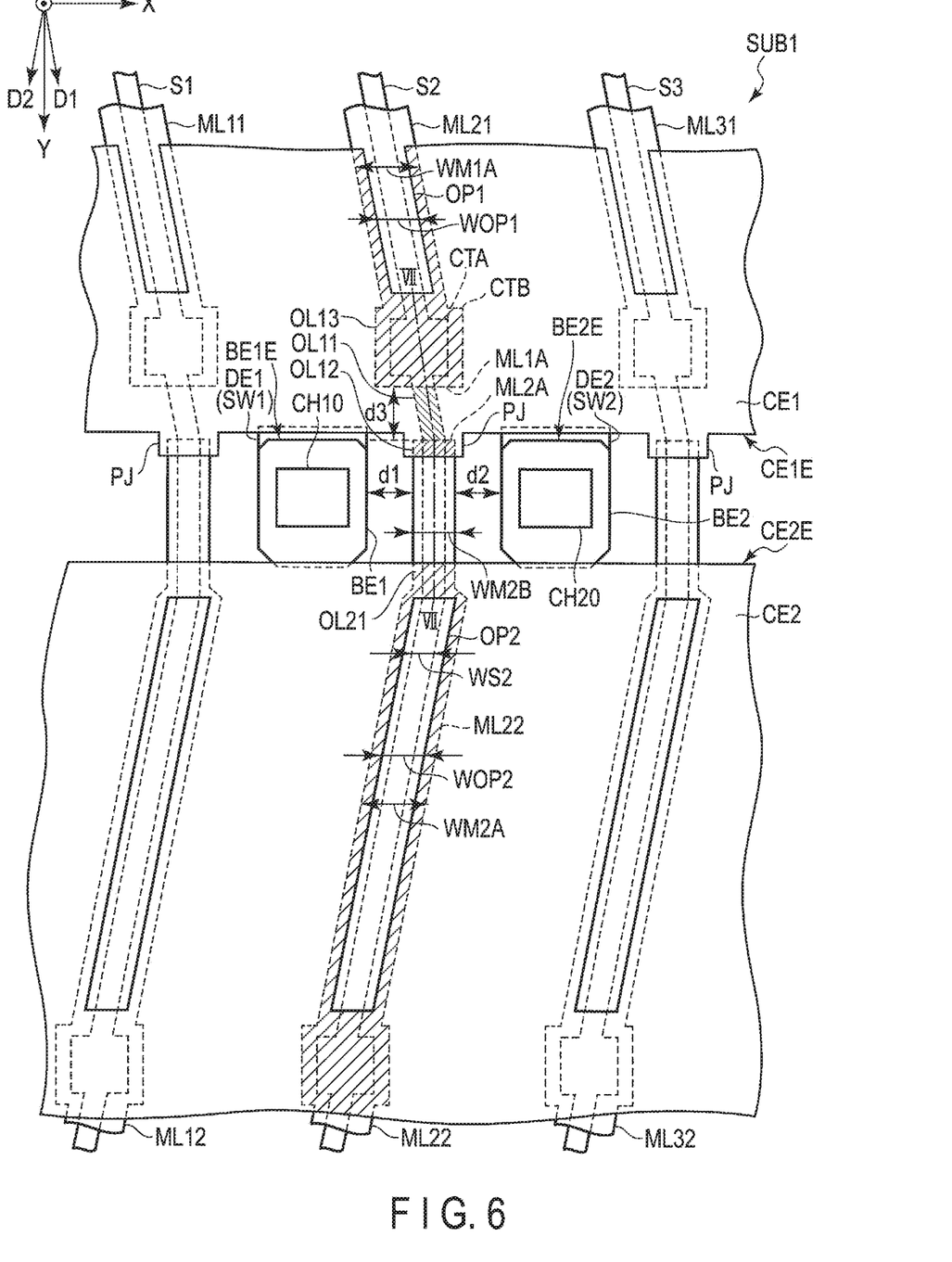
FIG. 6 is an enlarged plan view showing a main part of a first substrate SUB1 in a boundary area BA shown in FIG. 1.

FIG. 6 is an enlarged plan view showing a main portion of the first substrate SUB1 in the boundary area BA shown in FIG. 1. Note that the scanning line G2, the pixel electrodes PE1 to PE4 and the semiconductor layer SC are omitted from the illustration.

The first substrate SUB1 further comprises drain electrodes DE1 and DE2 and connection electrodes BE1 and BE2.

The signal lines S1 to S3 extend in the direction D1 in positions overlapping the common electrode CE1. The signal lines S1 to S3 extend in the direction D2 in positions overlapping the common electrode CE2. The signal lines S1 to S3 extend in the second direction Y between the common electrode CE1 and the common electrode CE2.

The metal wirings ML11 and ML12 overlap the signal line S1, and extend substantially in the second direction Y. The metal wiring ML12 is separated from the metal wiring ML11. Similarly, the metal wiring ML21 and ML22 overlap the signal line S2, and they are separated from each other. The metal wirings ML31 and ML32 overlap the signal line S3, and are separated from each other. The metal wirings ML11, ML21 and ML31 are arranged in the first direction X at intervals. The metal wirings ML12, ML22 and ML32 are arranged in the first direction X at intervals.

The drain electrodes DE1 and DE2 are located between the common electrode CE1 and the common electrode CE2, and are each formed into an island-like shape. The drain electrode DE1 is disposed between the signal line S1 and the signal line S2, and the drain electrode DE2 is disposed between the signal line S2 and the signal line S3. The drain electrodes DE1 and DE2 are located in the same layer as that of the signal line S2 and the like, and are formed of the same material as that of the signal line S2.

The connection electrodes BE1 and BE2 are located between the common electrode CE1 and the common electrode CE2, and are each formed into an island-like shape. The connection electrode BE1 overlaps the drain electrode DE1, and the connection electrode BE2 overlaps the drain electrode DE2. The connection electrode BE1 is in contact with the drain electrode DE1 via a contact hole CH10. The connection electrode BE2 is in contact with the drain electrode DE2 via a contact hole CH20. The connection electrodes BE1 and BE2 are located in the same layer as that of the metal wiring ML21 and the like, and are formed of the same material as that of the metal wiring ML21.

Here, the metal wiring ML21 and ML22 overlapping on the signal line S2 are focused. For example, the metal wiring ML21 is equivalent to a dummy wiring line D21 shown in FIG. 1, and the metal wiring ML22 is equivalent to the sensor wiring line L2 shown in FIG. 1.

The metal wiring ML21 includes an end portion ML1A. The metal wiring ML22 includes an end portion ML2A. The end portion ML1A and the end portion ML2A oppose each other in the second direction Y at an interval. The signal line S2 does not overlap any of the metal wirings between the end portion ML1A and the end portion ML2A, but overlaps the common electrode CE1. The signal line S2 includes a contact portion CTA to be brought into contact with the semiconductor layer SC, which will be described later. The contact portion CTA extends in the first direction X further than the other wiring portions. The metal wiring ML21 includes a contact portion CTB to be brought into contact with the common electrode CE1. The end portion ML1A is included in the contact portion CTB. That is, between contact portion CTB and metal wiring ML22, the signal line S2 is exposed without overlapping any of the metal wirings.

The common electrode CE1 includes an overlapping portion OL11 overlapping the signal line S2, between the end portion ML1A and the end portion ML2A, as indicated by slash lines in the drawing. Moreover, the common electrode CE1 includes an overlapping portion OL12 overlapping the metal wiring ML22, and an overlapping portion OL13 overlapping the metal wiring ML21. The overlapping portion OL11 is located between the overlapping portions OL12 and OL13. The common electrode CE1 includes a nonlinear end portion CE1E in a side opposing the common electrode CE2. That is, the common electrode CE1 includes a protruding portion PJ protruding towards the common electrode CE2. The protruding portion PJ includes the overlapping portion OL12. That is, the protruding portion PJ is formed to overlap the metal wiring ML22, and to be separated from the common electrode CE2.

The common electrode CE2 includes an overlapping portion OL21 overlapping the metal wiring ML22. The common electrode CE2 includes a linear end portion CE2E in the first direction X on a side opposing the common electrode CE1. The metal wiring ML22 overlaps the signal line S2 between the overlapping portion OL12 and the overlapping portion OL21.

The metal wiring ML22 extends between the connection electrodes BE1 and BE2. The connection electrodes BE1 and BE2 include end portions BE1E and BE2E, respectively, which are close to the end portion CE1E. In the example illustrated, the end portion ML2A and the end portions BE1E and BE2E are located on the same straight line in the first direction X. Note that the end portion ML2A overlaps the common electrode CE1, whereas the end portions BE1E and BE2E do not overlap the common electrode CE1.

Between the common electrodes CE1 and CE2, the connection electrode BE1, the metal wiring ML22 and the connection electrode BE2 are arranged in this order in the first direction X at intervals. The metal wiring ML22 and the connection electrodes BE1 and BE2 are located in the same layer as described above, but an interval (a first distance) d1 between the metal wiring ML22 and the connection electrode BE1 and an interval (a second distance) d2 between the metal wiring ML22 and the connection electrode BE2 are set to be sufficient to secure electric insulation from each other. The intervals d1 and d2 here are distances taken in the first direction X. Similarly, an interval (a third distance) d3 between the metal wirings ML21 (end portion ML1A) and ML22 (end portion ML2A) in the second direction Y is set to be sufficient to secure electric insulation from each other. As to the mutual relationship among the intervals d1 to d3, the intervals d1 and d2 are equal or greater than the interval d3. For example, the intervals d1 to d3 are about 1 to 10 μm.

The common electrode CE2 includes an opening OP2 overlapping the metal wiring ML22. In the illustrated example, the opening OP2 is a slit extending in the direction D2. The opening OP2 has a width WOP2. The metal wiring ML22 has a width WM2A in a position overlapping the opening OP2. The width WM2A is greater than the width WOP2. The overlapping portion OL21 is formed to surround the opening OP2. In this specification, the width is equivalent to the length taken in the first direction X. Similarly, the common electrode CE1 includes an opening OP1 overlapping the metal wiring ML21. The opening OP1 has a width WOP1. The metal wiring ML21 has a width WM1A in a position overlapping the opening OP1. The width WM1A is greater than the width WOP1. Note that the width WOP1 may be equivalent to the width WOP2, and the width WM1A may be equivalent to the width WM2A.

The end portion ML1A and the end portion ML2A are located between the protruding portion PJ and the opening OP1. The metal wiring ML22 has a width WM2B between the common electrode CE1 and the common electrode CE2 or between the connection electrode BE1 and the connection electrode BE2. The width WM2B is less than the width WM2A.

The signal line S2 has a width WS2. The widths WM2A and WM2B in the metal wiring ML22 are greater than the width WS2 in the signal line S2. The signal line 32 is located on an inner side with respect to the metal wiring ML22.

In the example shown in FIG. 6, the common electrode CE1 is equivalent to a first common electrode and the common electrode CE2 is equivalent to a second common electrode. The metal wiring ML21 is equivalent to a second metal wiring or a first wiring, and the metal wiring ML22 is equivalent to a first metal wiring or a second wiring. The overlapping portion OL11 is equivalent to a first overlapping portion, and the overlapping portion OL12 is equivalent to a second overlapping portion. The overlapping portion OL21 is equivalent to a third overlapping portion. The connection electrode BE1 is equivalent to a first connection electrode, and the connection electrode BE2 is equivalent to a second connection electrode. The drain electrode DE1 is equivalent to a first switching element, and the drain electrode DE2 is equivalent to a second switching element. The opening OP1 is equivalent to a first opening, and the opening OP2 is equivalent to a second opening. The widths WOP1 and WOP2 are each equivalent to a first width, and the widths WM1A and WM2A are each equivalent to a second width. The width WM2B is equivalent to a third width. The end portion ML1A is equivalent to a first end portion, and the end portion ML2A is equivalent to a second end portion. The interval d1 is equivalent to a first distance. The interval d2 is equivalent to a second distance. The interval d3 is equivalent to a third distance. Note that in the example shown in FIG. 6, the second direction Y can as well be referred to as the first direction.

Figure 7:
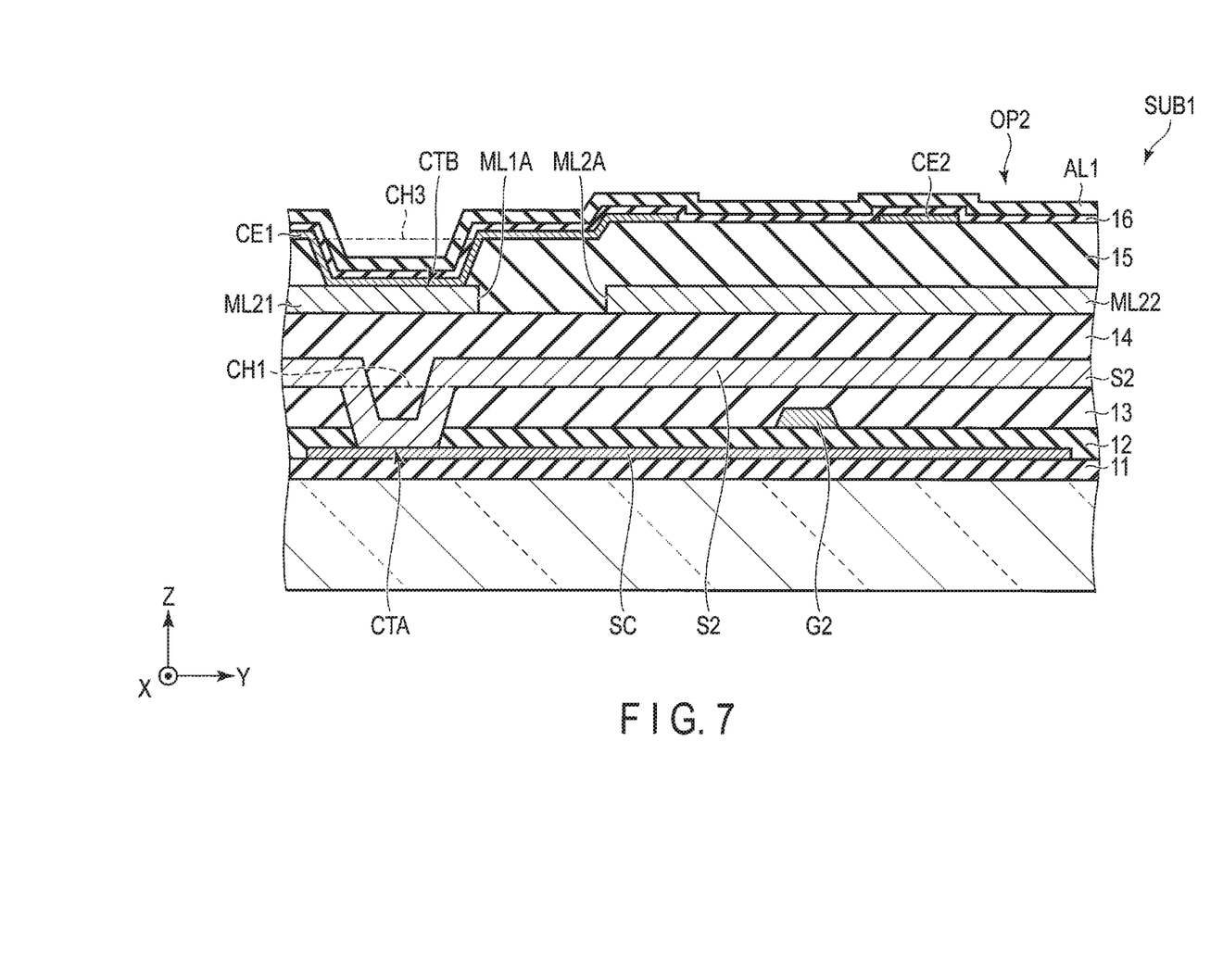
FIG. 7 is a cross-sectional view of the first substrate SUB1 taken along line VII-VII shown in FIG. 6.

FIG. 7 is a cross-sectional view of the first substrate SUB1 taken along line VII-VII shown in FIG. 6.

The first substrate SUB1 further comprises a semiconductor layer SC, a scanning line G2 and the like. The semiconductor layer SC is located on the insulating substrate 11, and is covered by the insulating film 12. The semiconductor layer SC is formed of, for example, polycrystalline silicon, but may be formed of amorphous silicon or an oxide semiconductor. The scanning line G2 is formed on the insulating film 12 and is covered by the insulating film 13. Note that the other scanning lines which are not shown are located in the same layer as that of the scanning line G2. The scanning line G2 is formed using one of the metal materials listed above.

The contact portion of the signal line S2 is in contact with the semiconductor layer SC via the contact hole CH11 which penetrates the insulating film 12 and the insulating film 13. The metal wirings ML21 and ML22 are located on the insulating film 14, and is covered by the insulating film 15. The metal wirings ML21 and ML22 are located between the signal line S2 and the common electrode CE1. The metal wirings ML21 and ML22 are located between the signal line S2 and the common electrode CE2. The insulating film 15 is in contact with the insulating film 14 between the end portion ML1A and the end portion ML2A. The contact portion CTB of the metal wiring ML21 is in contact with the common electrode CE1 via the contact hole CH3 which penetrates the insulating film 15. The common electrode CE1 covers immediately above the signal line S2 between the end portion ML1A and the end portion ML2A. That is, between the end portion ML1A and the end portion ML2A, the signal line S2, the insulating film 14, the insulating film 15 and the common electrode CE1 are stacked one on another in this order.

According to this embodiment with such a structure as described above, the signal line S2, in the boundary area BA of the sensor block B, overlaps the common electrode CE1 between the metal wiring ML21 which functions as the sensor wiring line L2 and the metal wiring ML22 which functions as the dummy wiring line D21. From another viewpoint, the signal line S2 overlaps the metal wiring ML22 between the common electrode CE1 which functions as the sensor electrode Rx1 and the common electrode CE2 which functions as the sensor electrode Rx2. Thus, the signal lines are each covered by one of the metal wirings or one of the common electrodes, and therefore it is possible to suppress leakage of the electric field from the signal line S2 to neighboring pixel electrodes PE. Thus, in each pixel, disorder in alignment of the liquid crystal molecules, which may be caused by the adverse effect of the undesirable electric field from a signal line, can be inhibited, and degradation in display quality can be suppressed.

Moreover, the metal wiring ML22 has a width WM2B, which is less than the width WM2A in the position overlapping the opening OP2, between the connection electrodes BE1 and BE2. For this reason, when patterning the metal wiring ML22, the connection electrode BE1 and the connection electrode BE2 formed in the same layer, electric short-circuiting between one another can be suppressed.

Moreover, the common electrode CE2 includes the opening OP2 overlapping the metal wiring ML22. Therefore, the parasitic capacitance between the common electrode CE2 and the metal wiring ML22 can be reduced. Note that in the opening OP2, the metal wiring ML22 overlaps the signal line S2, and leakage of the electric field from the opening OP2 can be suppressed.

Next, an example of layout of a spacer will be described.

Figure 8A:
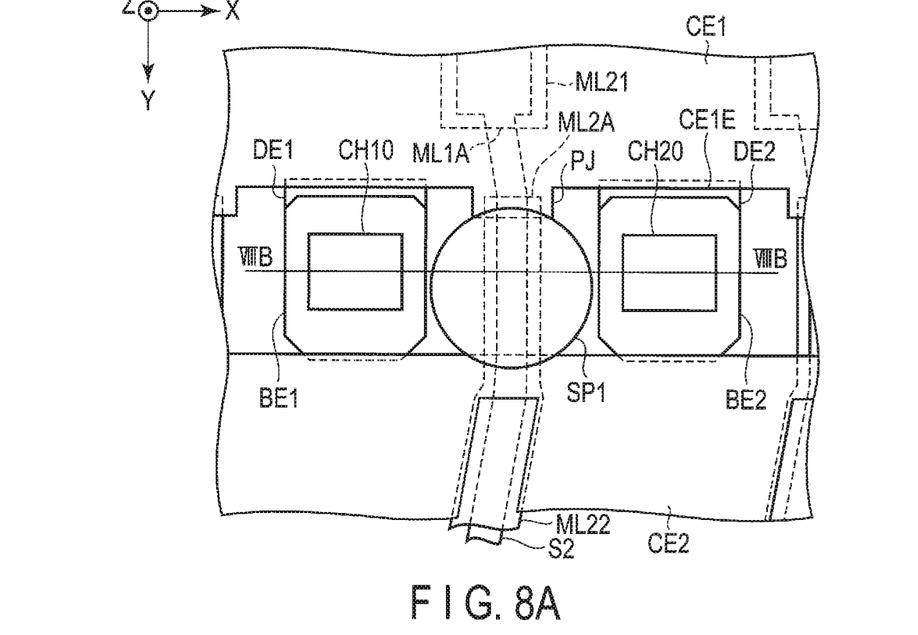
FIG. 8A is a plan view showing a configuration example of the display device DSP in the boundary area BA.
Figure 8B:
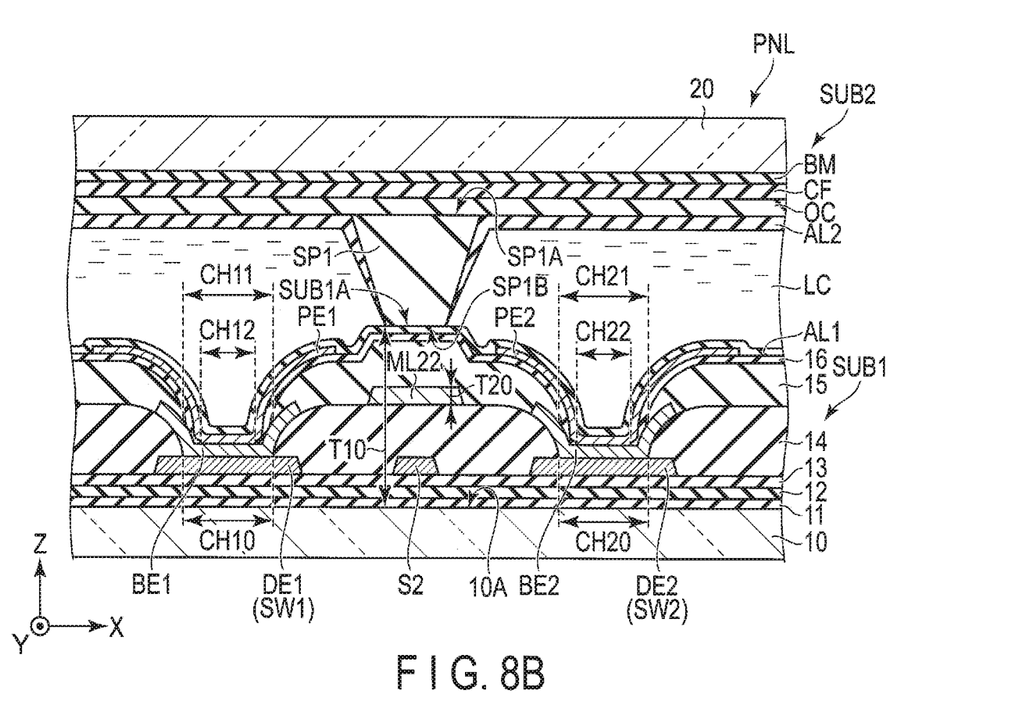
FIG. 8B is a cross-sectional view of the display panel PNL taken along line VIIIB-VIIIB shown in FIG. 8A.

FIGS. 8A and 88B each show a configuration example of the display device DSP in the boundary area BA.

FIG. 8A is a plan view showing the main part surrounding a spacer SP1 in the boundary area BA. The spacer SP1 is located between the common electrode CE1 and the common electrode CE2, and between the connection electrodes BE1 and BE2, and overlaps the metal wiring ML22. The spacer SP1 shown in FIG. 8A is equivalent to a first spacer located in the boundary area BA.

FIG. 8B is a cross section of the display panel PNL taken along line VIIIB-VIIIB shown in FIG. 8A. The pixel electrodes PE1 and PE2 are disposed on the insulating film 16 and are covered by the alignment film AL1. The pixel electrodes PE1 and PE2 are arranged so as to interpose the metal wiring ML2 therebetween. The pixel electrode PE1 is located immediately above the connection electrode BE1, and is in contact with the connection electrode BE via a contact hole CH11 which penetrates the insulating film 15 to the connection electrode BE1 and a contact hole CH12 which penetrates the insulating film 16 to the connection electrode BE1. Similarly, the pixel electrode PE2 is located immediately above the connection electrode BE1, and is in contact with the connection electrode BE2 via a contact hole CH21 which penetrates the insulating film 15 and a contact hole CH22 which penetrates the insulating film 16.

The spacer SP1 is provided in the second substrate SUB2. The spacer SP1 includes an upper surface SP1A which is in contact with the overcoat layer OC and a lower surface SP1B which oppose the first substrate SUB1. The spacer SP1 is located between the first substrate SUB1 and the second substrate SUB2, and forms a cell gap between the first substrate SUB1 and the second substrate SUB2. The cell gap is, for example, 2 to 5 μm. The spacer SP is formed of, for example, a resin material.

The first substrate SUB1 includes an upper surface SUB1A which opposes the spacer SP1. Here, the upper surface SUB1A is equivalent to the upper surface of the alignment film AL1. In a position overlapping the signal line S2 and the metal wiring ML22, the upper surface SUB1A and the lower surface SP1B may be in contact with each other, or the alignment film AL2 may be interposed between the upper surface SUB1A and the lower surface SP1B. The first substrate SUB1 has a thickness T10 in a position overlapping the lower surface SP1B. The thickness T10 is equivalent to the length from the upper surface 10A of the insulating substrate 10 to the upper surface SUB1A taken in the third direction Z. That is, the insulating film 14 is stacked to be in contact with the signal line S2 between the signal line S2 and the upper surface SUB1A, and the metal wiring ML22 is stacked to be in contact with the insulating film 14. The insulating film 15 is stacked to be in contact with the metal wiring ML22, and the insulating film 16 is stacked to be in contact with the insulating film 15. The alignment film AL1 is stacked to be in contact with the insulating film 16. In the example illustrated, no conductive layers other than the metal wiring ML22 exist between the signal line S2 and the lower surface SP1B. The metal wiring ML22 has a thickness T20 in the third direction Z. For example, the thickness T20 is 300 nm. In the example illustrated, the upper surface SUB1A projects towards a second substrate SUB2 side due to the influence of the thickness T20 in a position overlapping the metal wiring ML22.

Figure 9A:
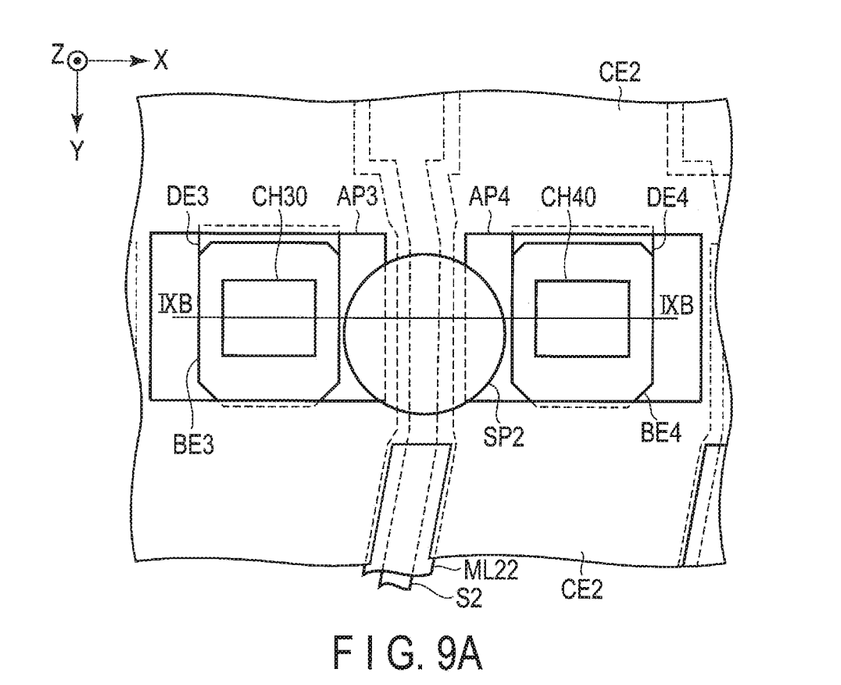
FIG. 9A is a plan view showing a configuration example of the display device DSP in an inner block area EA of a sensor block B shown in FIG. 1.
Figure 9B:
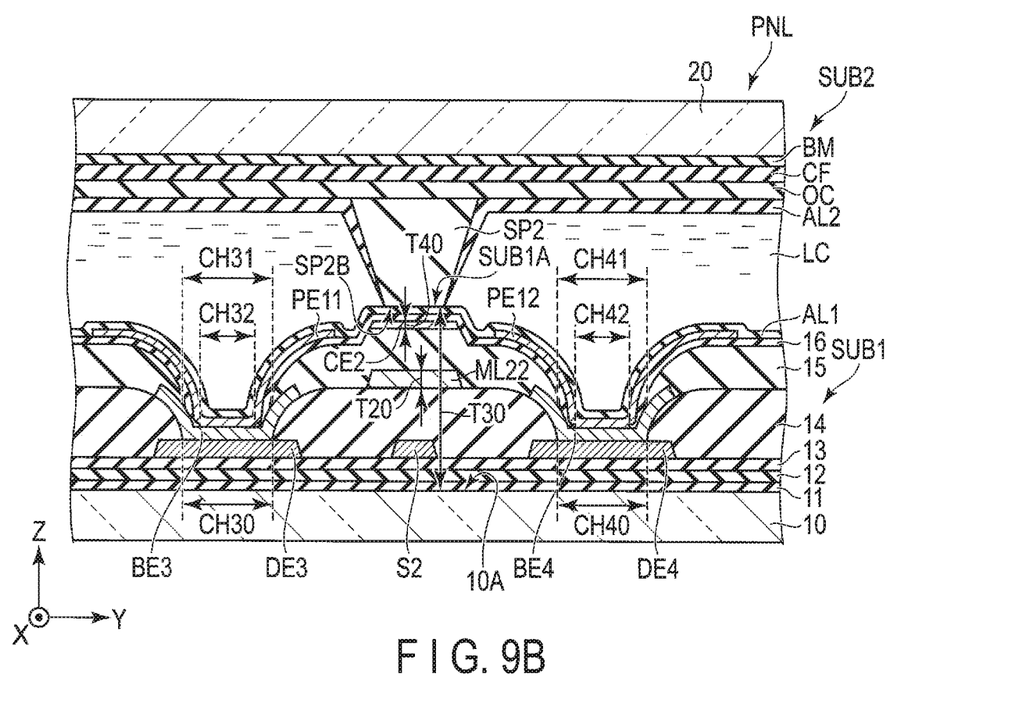
FIG. 9B is a cross-sectional view of the display panel PNL taken along line IXB-IXB shown in FIG. 9A.

FIGS. 9A and 9B each show a configuration example of the display device DSP in a block inner area EA of the sensor block B shown in FIG. 1.

FIG. 9A is a plan view showing the main part surrounding the spacer SP2 in the block inner area EA. The spacer SP2 is located between the connection electrodes BE3 and BE4 in the common electrode CE2, and overlaps the common electrode CE2. The common electrode CE2 includes an opening AP3 overlapping the connection electrode BE3 and the drain electrode DE3, and an opening AP4 overlapping the connection electrode BE4 and the drain electrode DE4. The common electrode CE2 overlaps the signal line S2 and the metal wiring ML22 between the connection electrodes BE3 and BE4.

The spacer SP2 shown in FIG. 9A is equivalent to a second spacer located in the block inner area EA, the connection electrode BE3 is equivalent to a third connection electrode, and the connection electrode BE4 is equivalent to a fourth connection electrode.

FIG. 9B is a cross section of the display panel PNL taken along line IXB-IXB shown in FIG. 9A. The connection electrode BE3, the metal wiring ML2, and the connection electrode BE4 are arranged in this order at intervals, and are located in the same layer. The connection electrode BE3 is in contact with the drain electrode DE3 via a contact hole CH30 which penetrates the insulating film 14. The pixel electrode PE11 is located immediately above the connection electrode BE3, and is in contact with the connection electrode BE3 via a contact hole CH31 which penetrates the insulating film 15 and a contact hole CH32 which penetrates the insulating film 16.

Similarly, the connection electrode BE4 is in contact with the drain electrode DE4 via a contact hole CH40. The pixel electrode PE12 is in contact with the connection electrode BE4 via contact, holes CH41 and CH42.

The first substrate SUB1 has a thickness T30 taken from the upper surface 10A in a position overlapping the lower surface SP2B of the spacer SP2. The thickness T30 is equivalent to the length to the upper surface SUB1A taken in the third direction Z. That is, the example shown in FIG. 9B is different from that of FIG. 8B in that the common electrode CE2 is interposed between the insulating films 15 and 16. That is, the thickness T30 is thicker by the portion of the thickness T40 of the common electrode CE2, as compared to the thickness T10. The thickness T40 is less than the thickness T20, and, for example, the thickness T40 is about ⅓ of the thickness T20. Therefore, the influence which may be caused on the cell gap due to the difference between the thickness T30 and the thickness T10 is extremely less.

Figure 10A:
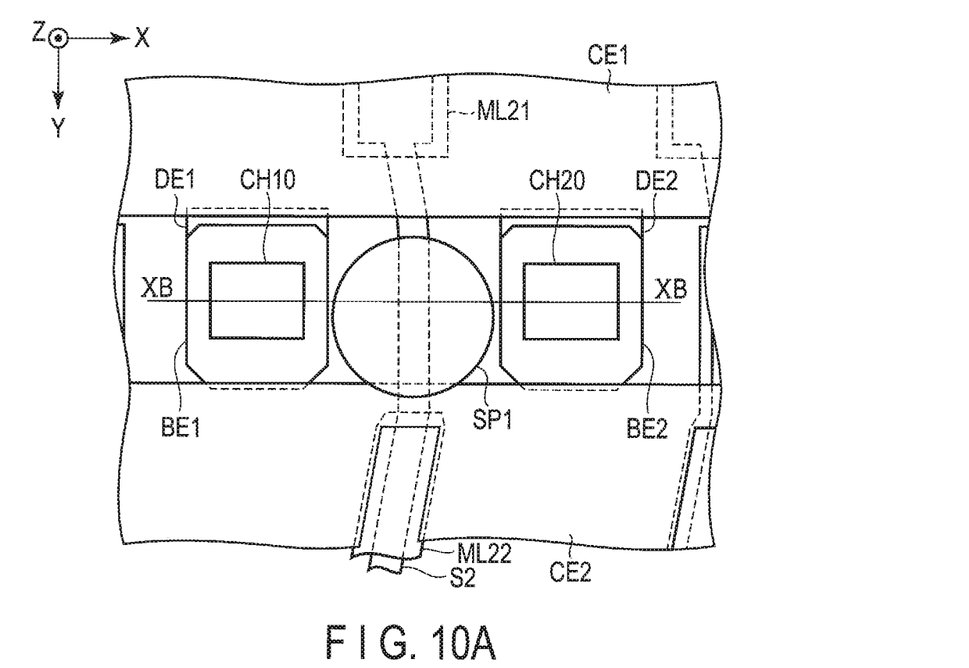
FIG. 10A is a plan view showing a comparative example of the display device DSP in the boundary area BA.
Figure 10B:
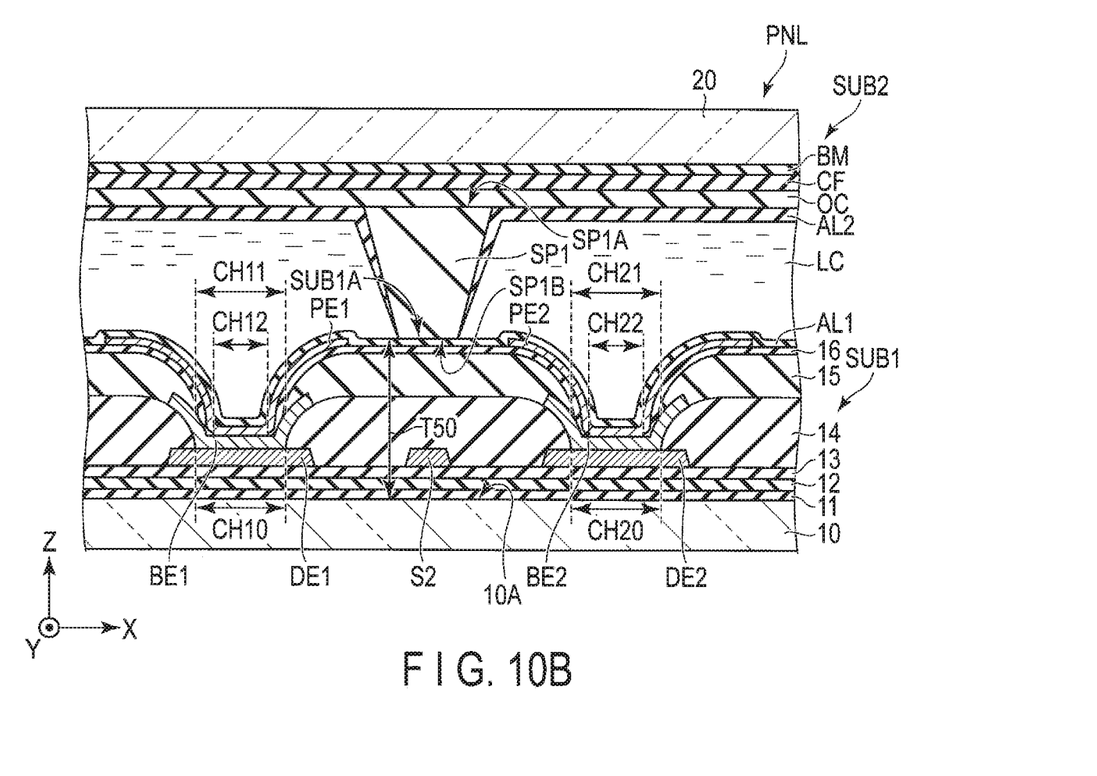
FIG. 10B is a cross-sectional view of the display panel PNL taken along line XB-XB shown in FIG. 10A.

FIGS. 10A and 10B each show a comparative example of the display device DSP in the boundary area BA.

FIG. 10A is a plan view showing the main part surrounding the spacer SP1 in the boundary area BA. The comparative example is different from the configuration example shown in FIG. 8A in that the spacer SP1 overlaps the signal line S1 and there is no metal wiring present between the signal line S2 and the spacer SP1.

FIG. 10B is a cross section of the display panel PNL taken along line X-X shown in FIG. 10A. The first substrate SUB1 has a thickness T50 taken from the upper surface 10A in a position overlapping the lower surface SP1B. The thickness T50 is thinner than the thickness T10 by a portion of the thickness T20 of the metal wiring ML22. That is, between the thickness T30 of the underlying layer of the spacer SP2 of the block inner area EA shown in FIG. 9B, and the thickness T50 of the underlying layer of the spacer SP1 in the boundary area BA shown in FIG. 10B, a level difference is created by a portion of a total of the thickness T20 of the metal wiring ML22 and the thickness T40 of the common electrode CE2. For this reason, in the comparative example, an uneven cell gap is formed, possibly causing degradation in display quality.

According to this embodiment, merely a level difference created by the thickness T40 of the common electrode CE2 is created between the thickness T30 of the underlying layer of the spacer SP2 of the block inner area EA shown in FIG. 9B and the thickness T10 of the underlying layer of the spacer SP1 in the boundary area BA shown in FIG. 5B. That is, substantially a uniform cell gap can be formed in the block inner area EA and the boundary area BA. Therefore, the degradation in display quality, which may result from the unevenness of the cell gap can be suppressed.

As described above, according to this embodiment, a display device which can suppress degradation of display quality can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The display panel PNL of this embodiment is not limited to the transmissive type having the transmissive display function which displays images by selectively transmitting light from a rear surface side of the first substrate SUB1, but may be of a reflective type having the reflective display function which displays images by selectively reflecting light from a front surface side of the second substrate SUB2, or a trans-reflective type having both the transmissive display function and the reflective display function.

Moreover, the embodiment is described in connection with the display panel PNL provided for the display mode using a lateral electric field along the main surface of the substrate. But, the embodiment is not limited to this, and it may be a display panel provided for any of a display mode using a vertical electric field along the normal of the main surface of the substrate, a display mode using an inclined electric field inclined in an oblique direction to the main surface of the substrate, and a display mode using a combination of a lateral electric field, a vertical electric field and an inclined electric field in any way. Note that the main surface of the substrate is a surface parallel to the X-Y plane.

What is claimed is:
1. A display device comprising:
a first common electrode;
a second common electrode separated from the first common electrode in a first direction;
a signal line extending in the first direction and overlapping the first common electrode and the second common electrode in a plan view;
a first metal wiring provided on the signal line and extending in the first direction; and
a second metal wiring provided on the signal line and separated from the first metal wiring in the first direction,
wherein
the first metal wiring overlaps the first common electrode in the plan view,
the second metal wiring overlaps the second common electrode in the plan view,
the first metal wiring includes a first end portion opposed to the second metal wiring and overlapping one of the first common electrode and the second common electrode, and
in a sectional view, the first metal wiring and the second metal wiring are located between the signal line and the first common electrode and between the signal line and the second common electrode.

2. The display device of claim 1, wherein
the first common electrode includes a protruding portion protruding toward the second common electrode, in a plan view, and
the protruding portion overlapping the first end portion.

3. The display device of claim 2, wherein
the first common electrode includes a first opening overlapping the second metal wiring, and
a second end portion of the second metal wiring is located between the protruding portion and the first opening.

4. The display device of claim 3, wherein
the second common electrode includes a second opening overlapping the first metal wiring,
the second opening has a first width, and
the first metal wiring has a second width greater than the first width in a position overlapping the second opening.

5. The display device of claim 4, wherein
the first metal wiring has a third width between the first common electrode and the second common electrode, and
the third width is less than the second width.

6. The display device of claim 1, wherein
the signal line overlaps the first common electrode between the first end portion and a second end portion of the second metal wiring.

7. The display device of claim 1, further comprising:
a first pixel electrode and a second pixel electrode arranged to overlap the first common electrode;
a first switching element connected to the first pixel electrode via a first connection electrode; and
a second switching element connected to the second pixel electrode via a second connection electrode,
wherein
the first metal wiring is located between the first pixel electrode and the second pixel electrode, and
the first connection electrode, the first metal wiring and the second connection electrode are located in a same layer, and separated from each other in a second direction crossing the first direction.

8. The display device of claim 7, wherein
the second metal wiring includes a second end portion overlapping the first common electrode,
a first distance between the first connection electrode and the first metal wiring in the second direction,
a second distance between the second connection electrode and the first metal wiring in the second direction,
a third distance between the first end portion and the second end portion in the first direction, and
the first distance and the second distance are greater than or equal to the third distance in a plan view.

9. The display device of claim 1, further comprising:
a first spacer,
wherein
the first spacer overlaps the first metal wiring between the first common electrode and the second common electrode.

10. A display device comprising:
a first pixel electrode;
a second pixel electrode;
a first switching element electrically connected to the first pixel electrode via a first connection electrode;
a second switching element electrically connected to the second pixel electrode via a second connection electrode;

a signal line electrically connected to the first switching element and extending in a first direction;
a first wiring overlapping the signal line and extending in the first direction;
a second wiring overlapping the signal line and separated from the first wiring in the first direction;
a first common electrode overlapping the first wiring; and
a second common electrode overlapping the second wiring,
wherein
the signal line is located between the first pixel electrode and the second pixel electrode in a plan view,
the first wiring, the first connection electrode and the second connection electrode are located in a same layer,
the first connection electrode is located between the first common electrode and the second common electrode,
the first wiring includes a first end portion and the second wiring includes a second end portion, the first end portion and the second end portion oppose each other, and
the first end portion and the second end portion overlap the first common electrode.

11. The display device of claim 10, further comprising: a first spacer,
wherein
the first spacer is located between the first common electrode and the second common electrode, and overlaps the second wiring.

12. The display device of claim 10, wherein
the first common electrode includes a protruding portion protruding toward the second common electrode, and
the protruding portion overlaps the second wiring.

13. The display device of claim 12, wherein
the first common electrode includes a first opening overlapping the first wiring, and
the first end portion and the second end portion are located between the protruding portion and the first opening.

14. The display device of claim 13, wherein
the second common electrode includes a second opening overlapping the second wiring,
the first opening and the second opening each have a first width,
the first wiring has a second width greater than the first width in a position overlapping the first opening, and
the second wiring has the second width in a position overlapping the second opening.

15. The display device of claim 14, wherein
the second wiring has a third width between the first common electrode and the second common electrode, and
the third width is less than the second width.

16. The display device of claim 10, wherein
the signal line overlaps the first common electrode between the first end portion and the second end portion.

17. The display device of claim 10, wherein
a first distance between the first connection electrode and the first metal wiring in the second direction,
a second distance between the second connection electrode and the first metal wiring in the second direction,
a third distance between the first end portion and the second end portion in the first direction, and
the first distance and the second distance are greater than or equal to the third distance in a plan view.

* * * * *